(12) United States Patent
Miller et al.

(10) Patent No.: US 8,598,916 B2
(45) Date of Patent: Dec. 3, 2013

(54) CIRCUIT HAVING GATE DRIVERS HAVING A LEVEL SHIFTER

(75) Inventors: Ira G. Miller, Tempe, AZ (US); Ricardo Takase Goncalves, Chandler, AZ (US); Geoffrey W. Perkins, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 688 days.

(21) Appl. No.: 12/818,235

(22) Filed: Jun. 18, 2010

(65) Prior Publication Data

US 2011/0309873 A1 Dec. 22, 2011

(51) Int. Cl.
*H03B 1/00* (2006.01)
*H03K 3/00* (2006.01)

(52) U.S. Cl.
USPC ........................................................ 327/108

(58) Field of Classification Search
USPC ........................................................ 327/108
See application file for complete search history.

(56) References Cited

U.S. PATENT DOCUMENTS

2008/0164931 A1* 7/2008 Kimura .......................... 327/333

OTHER PUBLICATIONS

U.S. Appl. No. 12/429,491, Inventor Ira G. Miller, titled "Circuitry in a Driver Circuit", filed Apr. 24, 2009.
Inventor Ira G. Miller, et al., titled "Switching Regulator With Input Current Limiting Capabilities".
Tang, et al., Charge Control: Modeling, Analysis, and Design, IEEE Transactions on Power Electronics, vol. 8, No. 4, Oct. 1993.
Linear Technology, "Switching Power Manager with USB On-the-Go + Triple Step-Down DC/DCs", LTC3576/LTC3576-1, pp. 1-48.
Linear Technology, "High Efficiency Battery Charger/USB Power Manager", LTC4088, pp. 1-24.

* cited by examiner

*Primary Examiner* — Daniel Rojas
(74) *Attorney, Agent, or Firm* — Daniel D. Hill (57) ABSTRACT

A circuit comprises a first level shifting circuit. The level shifting circuit comprises a first and second latching differential pairs. The first latching differential pair has first and second inputs for receiving first and second input signals, first and second outputs, and first and second power supply voltage terminals for receiving a first power supply voltage. The second latching differential pair has first and second inputs coupled to the first and second outputs of the first latching differential pair, an output, and first and second power supply voltage terminals for receiving a second power supply voltage, the second power supply voltage being different from the first power supply voltage. In one embodiment, the level shifting circuit protects transistor gates of the circuit from an overvoltage.

11 Claims, 6 Drawing Sheets

CIRCUIT HAVING GATE DRIVERS HAVING A LEVEL SHIFTER

BACKGROUND

1. Field

This disclosure relates generally to semiconductor devices and more specifically, to gate drivers.

2. Related Art

Integrated circuits are constantly being advanced by becoming smaller in area required to be implemented and using less power. Power is typically optimized with devices capable of operating at low voltage and having low transistor threshold voltages. A transistor's threshold voltage is the amount of voltage required to make the transistor become conductive. A transistor's control electrode or gate is electrically insulated from a bulk or substrate material by a gate oxide material. As transistors are formed with smaller geometries, the thickness of the gate oxide material has decreased significantly. As a result, the gate oxide layer of transistors has become vulnerable to being damaged by supply voltages that previously did not cause any damage. This voltage limitation creates a maximum value that a gate-to-source voltage, $V_{GS}$, a transistor may have. This maximum value is typically referred to as a transistor's gate breakdown voltage. The maximum voltage that the gate can sustain is often limited due to the thinner gate oxide thickness. Complex systems with varied circuitry operating at different voltage values can therefore provide voltages that exceed the breakdown voltage of the gate of some transistors. One approach to avoid the gate of the transistor from being exposed to such a large voltage is to use diodes that are switched in as needed. However, as more diodes are need, the size of the semiconductor device increases.

BRIEF DESCRIPTION OF THE DRAWINGS

The present invention is illustrated by way of example and is not limited by the accompanying FIGs., in which like references indicate similar elements. Elements in the FIGs. are illustrated for simplicity and clarity and have not necessarily been drawn to scale.

DETAILED DESCRIPTION

By implementing embodiments described herein, the transistors can continue to operate within a safe gate voltage (i.e., $V_{GS}$) range when the input voltage is not within a predefined safe range. This is accomplished by regulating the voltages that drive the gates of the NMOS and PMOS transistors to values within the safe gate voltage operating range.

Each gate driver may include a level shifter (or (level shifting circuit), which may include latching differential pairs. In one embodiment, a level shifter having two latching differential pairs are used to allow a circuit, such as a power management circuit, to operate with an input voltage greater than the maximum safe operating range of the transistor gate voltage without damaging the transistor gate. In one embodiment, the safe operating range of the transistor gate voltage is 5.1V, but the input voltages are 7V. The level shifters may have power supply voltages that are different. The circuit also may include additional level shifters, two sets of delay elements, where each set has an input coupled to the output of a level shifting circuit. In addition, each gate driver may include a buffer that includes a zener that protects the gate voltage of the transistor. In one embodiment, a buffer, which includes an operational amplifier, a current source, a zener diode and transistor, is used to protect the gate voltage of a PMOS transistor in the high side and another buffer with the same elements is used to protect the gate voltage of the NMOS transistor in the low side.

Figure 1:
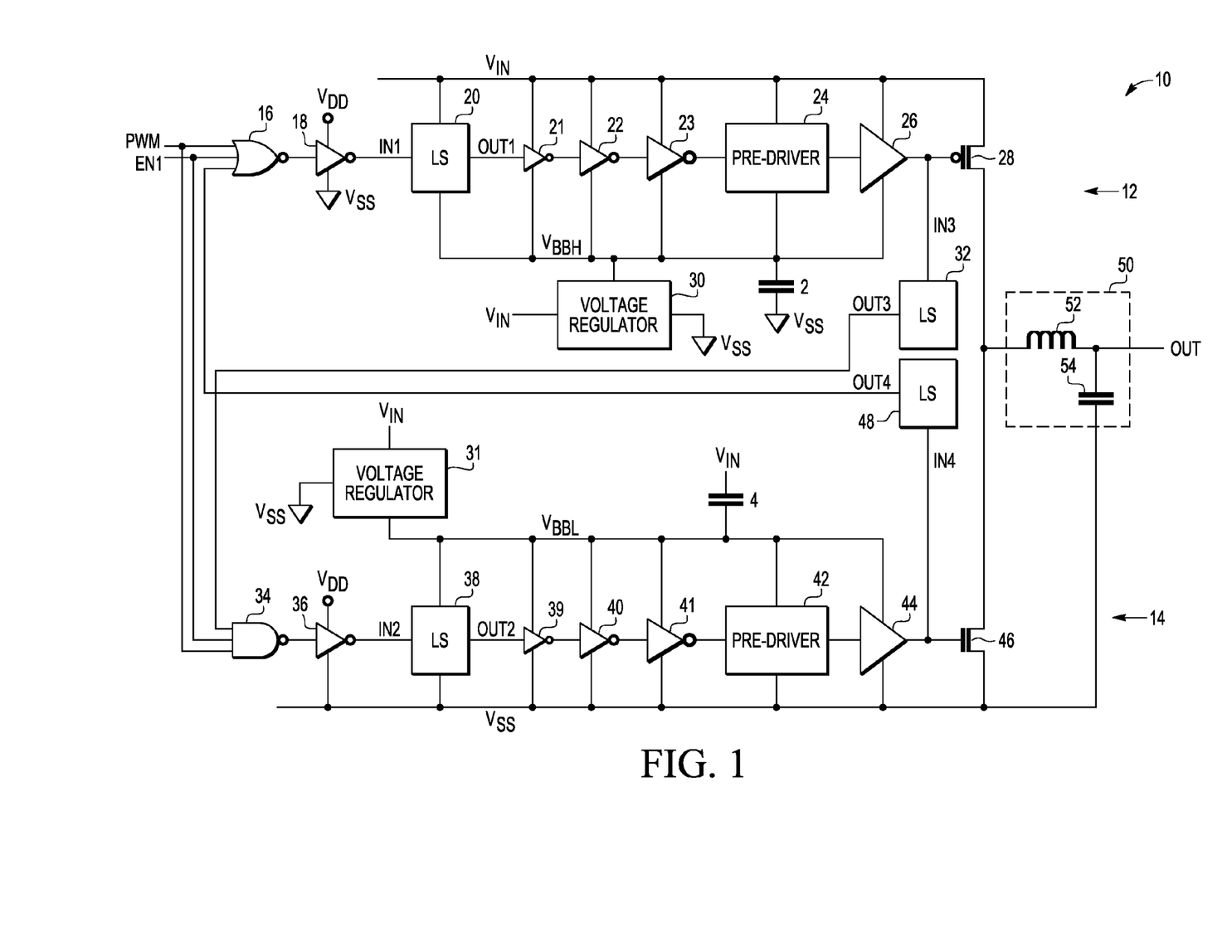
FIG. 1 illustrates a circuit having gate drivers in accordance with an embodiment.

FIG. 1 illustrates a circuit 10 having a (first) gate driver 12 and a (second) gate driver 14. In the embodiment illustrated, the gate driver 12 is a high side driver, which drives a PMOS power (or drive) transistor 28, and the gate driver 14 is the low side driver, which drives an NMOS power (or drive) transistor 46. The gate driver 12 includes logic circuitry 16, which in one embodiment is a NOR logic gate. The logic circuitry 16 has three inputs: a power write modulator clock-that-sends a PWM signal, an enable signal (EN), and feedback from a level shifter 48. The logic circuitry 16's output is coupled to an input of inverter 18, which also has inputs coupled to a first voltage VDD and supply voltage VSS. In one embodiment, the $V_{DD}$ voltage is more positive than the $V_{SS}$ voltage. The level shifter 20's output is to inverter 21, which is coupled to inverter 22. The inverter 22 is coupled to inverter 23. The inverters 21-23, in the embodiment illustrated, are tapered inverters used to increase the drive of the signal and can be referred to as delay elements. Each of the inverters 21-23 are coupled to input signal VIN and VBBH. The level shifter 20's input is also coupled to the VIN and VBBH. A voltage regulator 30 is coupled to VBBH, VIN, and VSS, which is ground. The voltage regulator 30 receives as input VIN and outputs VBBH.

The inverter 23's output (i.e., the output of the delay elements) is coupled to the input of a pre-driver 24 increases the drive capability to drive, which has its output coupled to a driver 26. The pre-driver 24 and driver 26 increase the strength so that is can drive the large gate capacitance of the large power PMOS 28. The driver 26's output is coupled to the PMOS power transistor 28 and provides the input to level shifter 32, with a signal that only allows the turn on of the power NMOS when the power gate drive to the power PMOS is in an off state. The output (OUT3) of level shifter 32 is coupled to the input of logic circuitry 34. The PMOS power transistor 28 has a current electrode coupled to the input VIN and another coupled to the output (OUT), which in the embodiment illustrated in FIG. 1, and includes coupling via drive circuitry 50, which in the embodiment illustrated is a capacitor 54 and an inductor 52. Capacitor 2 is coupled to VBBH and VSS and suppresses the transients of the gate driver 12 when the circuit is being switched.

Logic circuitry 34, in the embodiment illustrated is a NAND logic gate having three input signals. The input signals are PWM, EN and the input of the logic circuitry 34. The logic circuitry 34's output is coupled to the input of an inverter 36 that also receives as input VDD and VSS. The inverter 36's output is coupled to the input of level shifter 38, which is also coupled via its input to VBBL, which is the drive voltage of the low gate driver 14. In one embodiment, VBBH is greater than VBBL. The level shifter 38 is also coupled to VSS. A voltage regulator 31 is also coupled to VBBL, VIN, and VSS. The voltage regulator receives as input VIN and outputs to VBBL. The level shifter 38's output is coupled to inverter 39, inverter 40, and inverter 41. The inverters 39-41, in the embodiment illustrated are tapered inverters used to increase the drive of the signal and also may be referred to as delay elements. Each of the invertors 39-41 are coupled to VIN via their inputs and VSS.

The inverter 41 (i.e., the delay elements)'s output is coupled to the input of a pre-driver or 42, which has it's output coupled to a driver 44. The pre-driver 42 and drive 44 prepares the signal so that it has adequate strength to drive the large gate capacitance of the power NMOS transistor. The driver 44's output is coupled to the control electrode (or gate) of an NMOS power transistor 46 and provides the input to level shifter 48 which feeds back a signal that will hold the power PMOS drive off until the gate of the power N MOS is in the off state. The driver 44 and the pre-driver 42, if present, are a gate driver circuit. The output of level shifter 48, OUT4 is coupled to the input of logic circuitry 16. The NMOS power transistor 46 has an electrode coupled to VSS and another electrode coupled to the output (OUT), which in the embodiment illustrated in FIG. 1, and includes coupling via drive circuitry 50, which in the embodiment illustrated is a capacitor 54 and an inductor 52. Capacitor 4 is coupled to VBBH and VSS and suppresses the transients of the gate driver 14 when the circuit is being switched.

The power transistors 28 and 46 are alternately turned on to drive circuitry 50, which sends the output OUT to a device, such as a battery. For example, when VIN is greater or lower than the predetermined highest or lowest gate voltage of power transistors 28 and 46, the voltage regulator 30, which may include a zener diode, protects the PMOS power transistor 28 so that it does not receive the higher voltage. This protection is accomplished by adjusting the voltage for VBBH so that the PMOS power transistor 28 receives at its gate a value for VBBH that it is not greater than its predetermined maximum gate voltage. The level shifter 32 receives the voltage and the gate of the power PMOS and outputs it to the gate driver chain 14 for the NMOS power transistor 46. The input to the gate 34 is a VSS and VDD logic level. When VIN is greater than the predetermined maximum gate voltage for the power transistor 46, the voltage regulator 31, which may include a zener diode, protects the NMOS power transistor 46 so that it does not receive the excess voltage. This protection is accomplished by regulating the voltage for VBBL so that the NMOS power transistor 46 receives at its gate at a value for VBBL that it is less than its predetermined maximum gate voltage. The level shifter 48 receives the gate voltage of the power NMOS transistor and shifts it to the input of the NOR gate (VDD maximum) of the gate drive circuitry for the PMOS power transistor 28.

Figure 2:
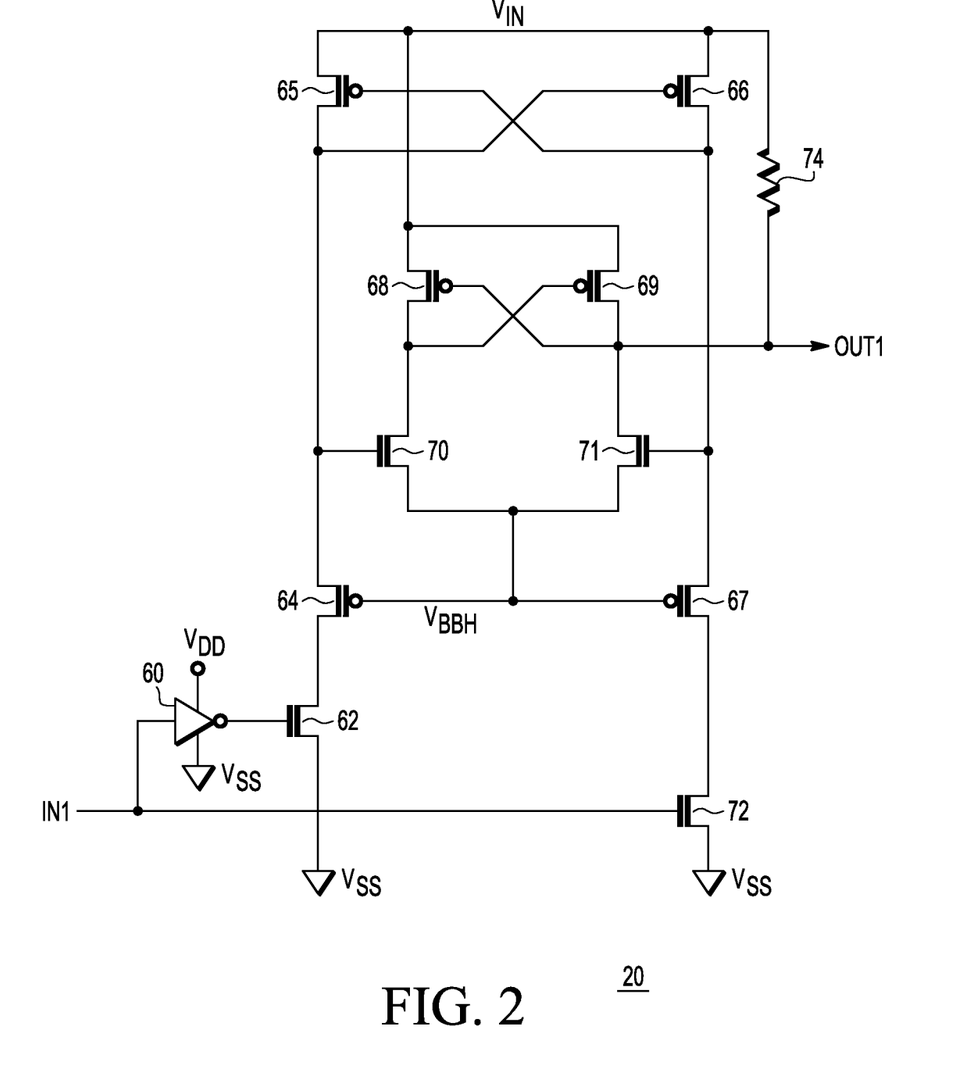
FIG. 2 illustrates a level shifter that can be used in a gate driver of FIG. 1 in accordance with an embodiment.

FIG. 2 illustrates an example of level shifter 20 that can be used in the gate driver 12 of FIG. 1 in accordance with an embodiment. In other words, the level shifter of FIG. 2 can be used as the level shifter 20 (of the gate driver 12) in FIG. 1 that is coupled to the inventers 18 and 21. The level shifter 20 includes two latching differential pairs. The first latching differential pair includes the PMOS transistors 64-67, which are coupled together. In particular, the PMOS transistor 65 is cross coupled to the PMOS transistor 66 and coupled to transistor 64. Transistor 64's control electrode is coupled to the control electrode of transistor 67, which has a current electrode coupled to transistor 66. The second latching differential pair includes the transistors 68-71. Transistors 68 and 69 are PMOS transistors which are cross coupled to each other. Transistors 70 and 71 are NMOS transistors which have current electrodes coupled to each other and other current electrodes coupled to PMOS transistors 68 to 69, respectively. Transistor 68 has its current electrodes coupled to OUT1 and VIN. In one embodiment, resistor 74 may be coupled to a node of VIN and a current electrode of transistor 66 and a node formed from the current electrodes of transistors 68 and 69, and output OUT1. In one embodiment, resistor 74 is not present. The current electrodes of transistors 70 and 71 are coupled to VBBH, which the control electrodes of transistors 64 and 67 are also coupled to. The current electrode of transistor 64 of the first latching pair is coupled to a current electrode of NMOS transistor 62, which has its other current electrode coupled to VSS and its control electrode coupled to the output of inverter 60. The inverter 60 has its inputs coupled to VDD and VSS input signal IN1. The current electrode of transistor 67 of the first latching pair is coupled to a current electrode of NMOS transistor 72, which has its current electrode coupled to VSS and its control electrode coupled to IN1.

The level shifter 20 of FIG. 1 is a latch driving a comparator. In one embodiment, the latch is transistors 64-67 that drive the comparator 68-71. The voltage VBBH is provided by voltage regulator 30 in FIG. 1, which keeps the voltage applied to the PMOS gates to within a safe value that is a zener voltage (e.g., 5.1 V) below VIN when VIN exceeds the zener voltage. For voltages less than 5.1 volts the voltage is equal to VIN. For example, if the input voltage VIN is 4.5 volts, the voltage VBBH is 4.5 volts.

Figure 3:
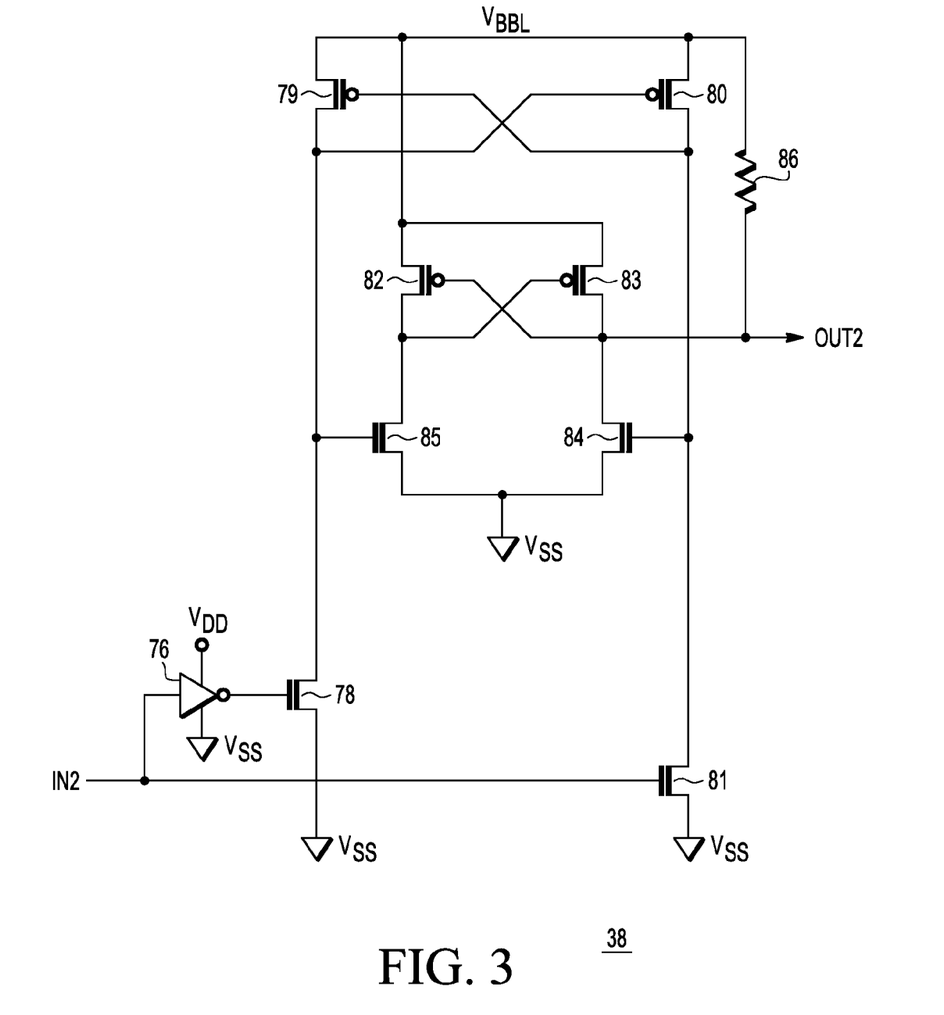
FIG. 3 illustrates a level shifter than can be used in a gate driver of FIG. 1 in accordance with an embodiment.

FIG. 3 illustrates an example of level shifter 38 that can be used in the gate driver 14 of FIG. 1 in accordance with an embodiment. In other words, the level shifter of FIG. 3 can be used as the level shifter 38 (of the gate driver 14) in FIG. 1 that is coupled to the inventers 36 and 39. The level shifter 38 is similar to the level shifter 20 of FIG. 2 except that the equivalent of the PMOS transistors 64 and 67 of FIG. 2 are not used to limit the output swing to VBBH. In the configuration the output OUT2, will swing between upper limit (set by VBBL), and the lower limit, which is VSS.

The level shifter 38 also includes latching differential pairs. The latching differential pair includes the transistors 82-85. Transistors 84 and 85 are NMOS transistors, which are coupled to each other via their current electrodes and to PMOS transistors 83 and 82 via their other current electrodes, respectively. Their other current electrodes are coupled to VSS. Transistors 82 and 83 are PMOS transistors which are cross coupled to each other via their current electrodes. Transistor 82 has a current electrode coupled to OUT2 and VBBL. In one embodiment, resistor 86 may be coupled to VBBL, a node of transistors 82-84, and OUT2. In one embodiment, resistor 86 is not present. Transistors 82, 83, 71, and 80 all have a current electrode coupled to VBBL. Transistor 78 has a current electrode coupled to VSS and another to the current electrode of transistor 79. The current electrode of transistor 78 is coupled to inverter 76. The inverter 76's input is coupled to VDD and VSS and input signal IN2. Transistors 78 has its control electrodes coupled to the output of the inverter 76 and its current electrode coupled to VSS. PMOS transistor 79's control electrode is cross coupled to the control electrode of PMOS transistor 80, which has one current electrode coupled to NMOS transistor 81 and the other to VBBL. NMOS transistor 81's control electrode is coupled to IN2 and its current electrodes are coupled to VSS and of NMOS transistor 78, which is coupled to PMOS transistor 79. The purpose of this circuit is to translate a signal that swings between VDD and VSS to a level between VBBL and VSS to drive the NMOS transistors in the low switching branch. The circuit is similar to FIG. 2 and includes the stage consisting of transistors 82, 83, 84 and 85 to match the behavior of transistors 68, 69, 70, and 71. It is desirable that the delays in the level shifters of FIG. 2 and FIG. 3 match and track each other for the various operating conditions they will be subjected to.

Figure 4:
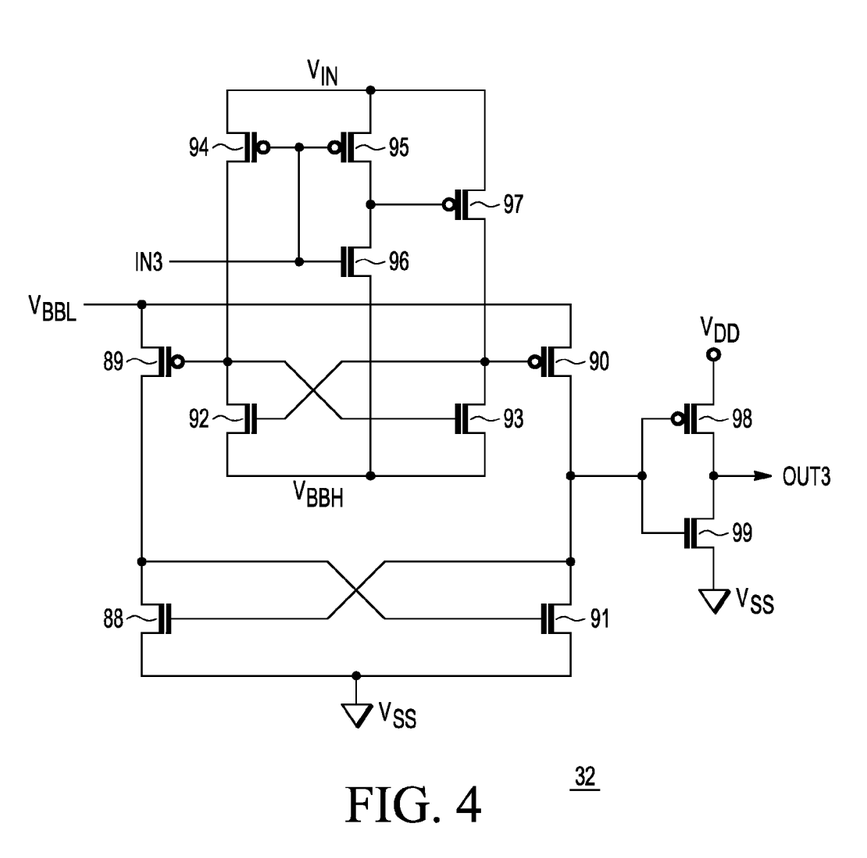
FIG. 4 illustrates a level shifter than can be used in a gate driver of FIG. 1 in accordance with an embodiment.

FIG. 4 illustrates a level shifter 32 that can be used in the gate driver 12 of FIG. 1 in accordance with an embodiment. In other words, the level shifter of FIG. 4 can be used as the level shifter 32 (of the gate driver 12) in FIG. 1 that receives its input from the driver 26 and whose output (OUT3) is coupled to the input of the low voltage (VDD to VSS) logic circuitry 34. A (first) differential latch includes transistors 88-91. Transistor 88 is an NMOS transistor that has its current electrode cross coupled to that of transistor 91, which is also an NMOS transistor. Transistor 88's current electrodes are coupled to a current electrode of PMOS transistor 89 and VSS. Transistor 91's current electrodes are coupled to a current electrode of PMOS transistor 90 and VSS. Transistors 89-90's other current electrodes are coupled to VBBL and have current electrodes coupled to transistors 92-93, respectively. Transistors 92-93 are NMOS transistors that are cross coupled to each other and form a (second) differential latch with transistors 94 and 97, which are PMOS transistors. The second differential latch also includes PMOS transistor 95 and NMOS transistor 96, which have their current electrodes coupled together and send an output to the current electrode of transistor 97. A current electrode of transistor 96 is coupled to VBBH along with current electrodes of transistors 92 and 93. The current electrodes of the transistors 94-95 are coupled together to a node, which is coupled to input signal IN3. Current electrodes of transistors 90 and 91 are coupled to a node that couples the control electrodes of PMOS transistor 98 and NMOS transistor 99. Transistors 98-99's other current electrodes are coupled to a node for output OUT 3. Transistor 98's other current electrode also coupled to VDD and transistor 99's other current electrode is coupled to VSS. The purpose of the circuit shown in FIG. 4 is to translate a signal between VIN and VBBL to a signal that can drive logic with a swing between VSS and VDD. The input signal is applied to IN3. It comes from the gate of the power PMOS transistor. The swing is from VIN to VBBH. In the high state when IN3 is at VIN, transistor 96 and 97 are on and transistors 94 and 95 are off. This condition will result in an off state for 88, 90, 93, and an on state for 89, 92, and 91. The logic state is passed through the inverter 98 and 99 to OUT3. The opposite condition exists for IN3 low, which is VBBH.

Figure 5:
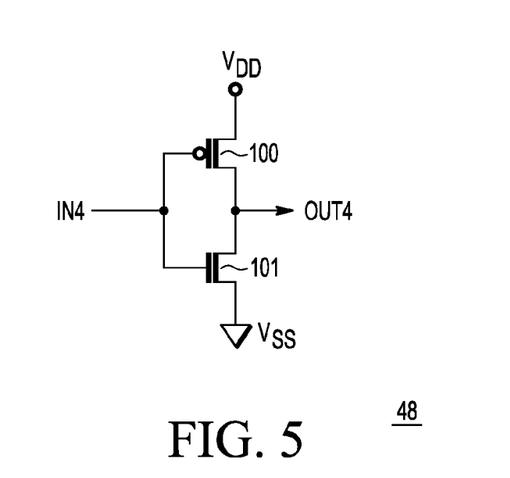
FIG. 5 illustrates a level shifter than can be used in a gate driver of FIG. 1 in accordance with an embodiment.

FIG. 5 illustrates a level shifter 48 than can be used in a gate driver 14 of FIG. 1 in accordance with an embodiment. In other words, the level shifter of FIG. 5 can be used as the level shifter 48 (of the gate driver 14) in FIG. 1 that receives its input from the driver 44 and whose output (OUT4) is coupled to the input of the logic circuitry 34. PMOS transistor 100 and NMOS transistor 101 both have their control electrodes coupled to input signal IN4 and their other current electrodes coupled to output OUT4. A current electrode of PMOS transistor 100 is coupled to VDD and a current electrode of transistor 101 is coupled to VSS. In this embodiment, the input signal IN4 can be is modified by transistors 100-101 based on their response to VDD and VSS to produce OUT 4. The purpose of the stage is to translate a signal varying between VBBL and VSS to a signal that varies between a logic level of VDD and VSS.

Figure 6:
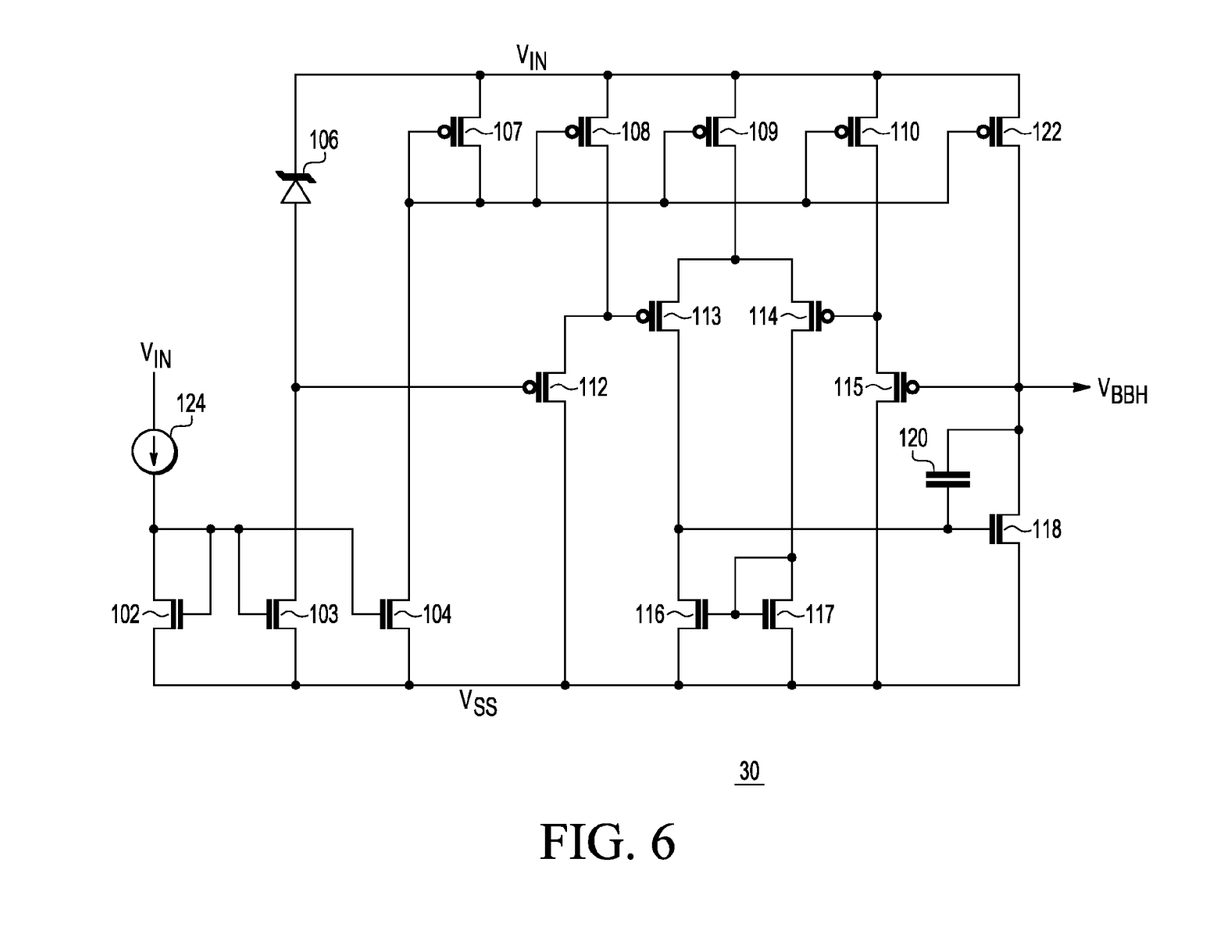
FIG. 6 illustrates a voltage regulator than can be used in a gate driver of FIG. 1 in accordance with an embodiment.

FIG. 6 illustrates a voltage regulator 30 than can be used in the gate driver 12 of FIG. 1 in accordance with an embodiment. In other words, the voltage regulator of FIG. 6 can be used as the voltage regulator 30 (of the gate driver 12) in FIG. 1 that is coupled to VBBH, VIN, and VSS. The voltage regulator 30 includes a current source 124 which has its input coupled to VIN and its output coupled to a current electrode of NMOS transistor 102 and the control electrodes of NMOS transistors 102-104, which are in parallel with each other. The other current electrode of transistor 102 is coupled to VSS. Transistor 103 has a current electrode coupled to the zener diode 106, which is also coupled to VIN, and the control electrode of a PMOS transistor 112. Transistor 104 has a current electrode coupled to VSS and the other current electrode coupled to the control electrodes of each of the PMOS transistors 107-110, which are all in parallel with each other and have their other current electrodes coupled to VIN. Transistor 104's current electrode that is coupled to the control electrodes of transistors 107-110 is also coupled to a current electrode of transistor 107. Transistor 104 and one of the current electrodes of each of the transistors 107-110 are coupled to a control electrode of PMOS transistor 122, which has one current electrode coupled to VIN and another current electrode coupled to a node that is coupled to a node for VBBH. The current electrode of the PMOS transistor 115 and both capacitor 120 and a current electrode of NMOS transistor 118 are also coupled to the node for VBBH. Transistor 118 has one of its current electrodes also coupled to node of the capacitor 120 and VBBH and another coupled to VSS.

PMOS transistor 112 has one current electrode coupled to VSS and another coupled to both a current electrode of transistor 108 and the control electrode of PMOS transistor 113. Transistor 113 has the one current electrode coupled to a current electrode of transistor 109 and another current electrode coupled to a current electrode of NMOS transistor 116. NMOS transistor 116 has its other current electrode coupled to VSS and its control electrode coupled to a node that is coupled to both a current electrode and the control electrode of NMOS transistor 117. The other current electrode of transistor 117 is coupled to VSS.

PMOS transistor 114, like transistor 113, has a current electrode coupled to the same current electrode of transistor 109. The other current electrode of transistor 114 is coupled to transistor 117. The control electrode of transistor 114 is coupled to a current electrode of the PMOS transistor 115. The other current electrode of the transistor 115 is coupled to VSS. In one embodiment, current from transistor 103 is pulled down through the zener diode 106 placing a voltage on the input of 112, which is the input of the operational amplifier. The amplifier is configured for unity gain resulting in the voltage from the zener appearing at VBBH with increased current pull down capability to absorb current spikes from the circuits VBBH is protecting from receiving excess gate voltage.

Figure 7:
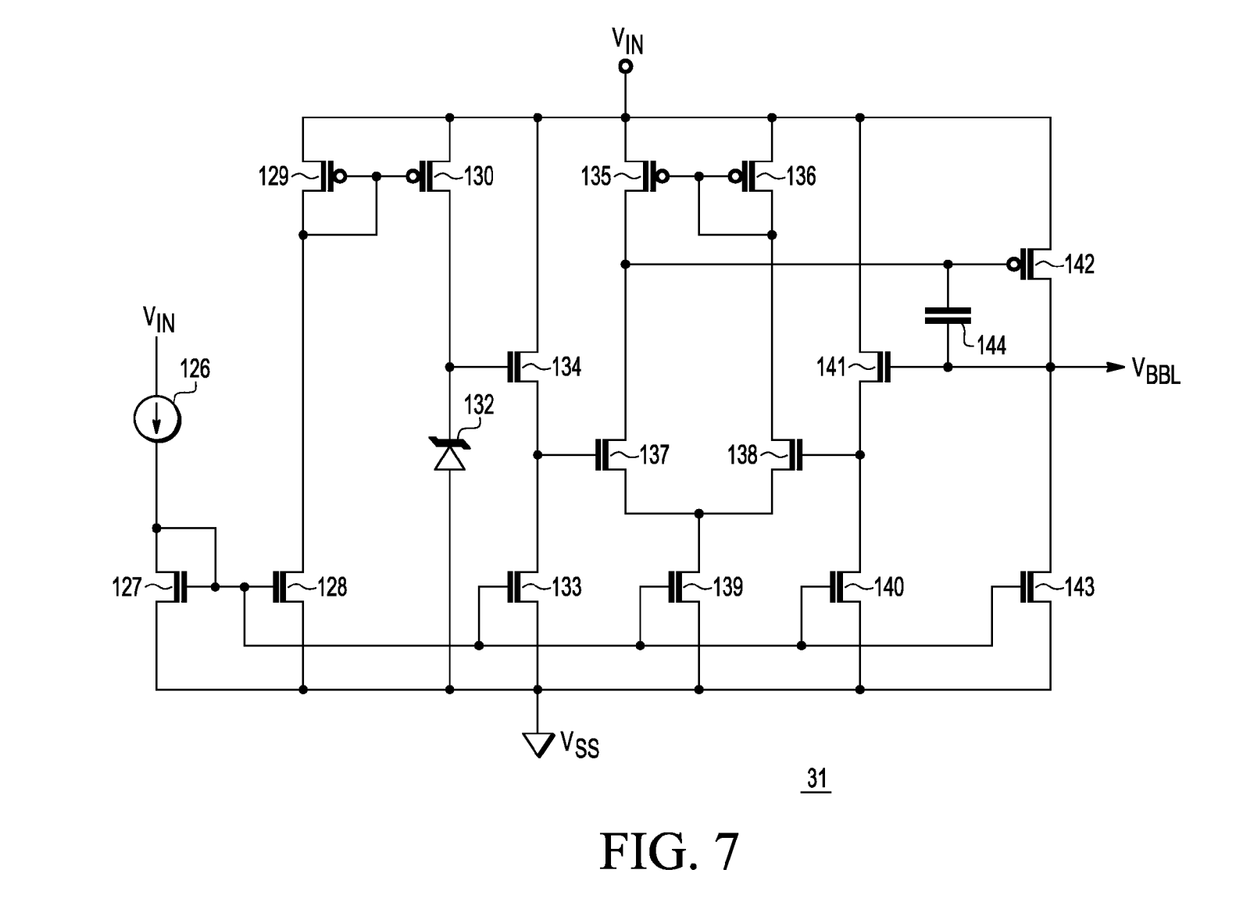
FIG. 7 illustrates a voltage regulator that can be used in a gate driver of FIG. 1 in accordance with an embodiment.

FIG. 7 illustrates a voltage regulator 31 that can be used in the gate driver 14 of FIG. 1 in accordance with an embodiment. In other words, the voltage regulator of FIG. 7 can be used as the voltage regulator 31 (of the gate driver 14) in FIG. 1 that is also coupled to VBBL, VIN, and VSS. The voltage regulator 31 includes a current source 126 that has its input coupled to VIN and its output coupled to NMOS transistor 127. Transistor 127 has its current electrode coupled to the control electrode. The other current electrode of transistor 127 is coupled to VSS. The current electrode coupled to current source 126 is tied to the control electrode of the transistor 127. The control electrode of transistor 127 is coupled to a node that is coupled to its current electrode, the control electrode of NMOS transistor 128, and the control electrodes of NMOS transistors 127, 128, 133, 139, 140, and 143. A current electrode of each of the transistors 133, 139, 140, and 143 are coupled to VSS as is zener diode 132. The zener diode 132 is also coupled to a node coupled to a current electrode of the PMOS transistor 130 and the control electrode of NMOS transistor 134. The other current electrode of PMOS transistors 130 is coupled to VIN. The control electrode of transistor 130 is coupled to the control electrode of PMOS transistor 129, which has its control electrode tied to a current electrode and another current electrode coupled to VIN.

Transistor 134 has one current electrode coupled to VIN and the other to a node coupled to the control electrode of NMOS transistor 137 and a current electrode of transistor 133. Transistor 137 has a current electrode coupled to a node coupled to i) the current electrode of PMOS 135, and ii) a node formed by the control electrode of PMOS transistor 142 and a capacitor 144. The other current electrode of transistor 137 is coupled to a node formed by the current electrode of transistor 139 and a current electrode of NMOS transistor 138. The other current electrode of transistor 138 is coupled to a current electrode of PMOS transistor 136, which is tied to the control electrode of transistor 136. The control electrode of transistor 136 is coupled to the current electrode of PMOS transistor 135. Both transistors 135 and 136 have current electrodes that are coupled to VIN. Transistor 136 has a current electrode coupled to NMOS transistor 138. The control electrode of transistor 138 is coupled to a current electrode of NMOS transistor 141 and a current electrode of NMOS transistor 140. The other current electrode of transistor 141 is coupled to VIN. The control electrode of transistor 141 is coupled to capacitor 144 and sends a voltage to a node that outputs VBBL. A current electrode of PMOS transistor 142 is also coupled to this node as is a current electrode of NMOS transistor 143. The other current electrode of transistor 142 is coupled to VIN. The other current electrode of transistor 143 is coupled to VSS. In one embodiment, current from transistor 130 is pushed down through the zener diode 132 placing a voltage on the input of 137, which is the input of the operational amplifier. The amplifier is configured for unity gain resulting in the voltage from the zener appearing at VBBL with increased current pull up capability to absorb current spikes from the circuits VBBL is protecting from receiving excess gate voltage.

By now it should be appreciated that there has been provided a circuit, such as a power metal oxide semiconductor (MOS) gate drive circuit that allows for the use of MOS transistors to operate in a driver stage with a rail voltage in excess of the safe operating gate voltage of the transistors. The circuit includes two gate drivers that each includes a level shifter. Each level shifter may include two latching differential pairs. In one embodiment, the level shifter protects the transistors (or more specifically the transistor gates) from an overvoltage. In one embodiment, the level shifters provide substantially a same gate delay meaning that the gate delay is the same or if different, the difference, does not negatively impact the circuit. Each gate driver may also include a voltage regulator. One voltage regulator includes a zener diode, a current source coupled to the zener diode and a comparator having a first input terminal coupled to the zener diode. Furthermore, these approaches allow for finer steps in the gate voltage protection when the input voltage VIN increases to values above the gate breakdown voltage 5.1 V. The techniques described limits the gate voltage for both the NMOS and PMOS to the safe 5.1V. For example, if VIN is 6.5V, the NMOS gate is clamped to 5.1V above VSS and the PMOS gate voltage is clamped to 5.1V below the input VIN. If the input voltage is 5.5V, for example the gate voltage is still limited to 5.1V. For VIN equal to 4.5V, the gate voltages are 4.5V, as they would be without the clamping technique.

In one embodiment, a circuit includes a first level shifting circuit that has a first latching differential pair having first and second inputs for receiving first and second input signals, first and second outputs, and first and second power supply voltage terminals for receiving a first power supply voltage; and a second latching differential pair having first and second inputs coupled to the first and second outputs of the first latching differential pair, an output, and first and second power supply voltage terminals for receiving a second power supply voltage, the second power supply voltage being different from the first power supply voltage. In a further embodiment, the first power supply voltage terminal of the first latching differential pair is coupled to a first voltage level, the second power supply voltage terminal of the first latching differential pair is coupled to ground, the first power supply voltage terminal of the second latching differential pair is coupled to the first voltage level, and the second power supply voltage terminal of the second latching differential pair coupled to a second voltage level, wherein the second voltage level is between the first voltage level and ground. In a further embodiment the circuit further has a first logic gate having an output coupled to one of the first and second inputs of the first latching differential pair, and first and second power supply voltage terminals for receiving a third power supply voltage different from the first power supply voltage and the second power supply voltage. In a further embodiment the circuit has a first plurality of delay elements coupled in series and having an input coupled to the output of the second latching differential pair, and an output; a first gate driver circuit having an input coupled to the output of the first plurality of delay elements; and an output; and a first drive transistor having a first current electrode coupled to the first power supply voltage terminal, a control electrode coupled to the output of the first gate driver circuit, and a second current electrode coupled to an output terminal of the circuit. This circuit, in one embodiment, further has a second level shifting circuit having an input for receiving an input signal at a first voltage level, and an output for providing an output signal at a second voltage level; a second plurality of delay elements coupled in series and having an input coupled to the output of the second level shifting circuit, and an output; a second gate driver circuit having an input coupled to the output of the second plurality of delay elements, and an output; and a second drive transistor having a first current electrode coupled to the second current electrode of the first drive transistor, a control electrode coupled to the output of the output of the second gate driver circuit, and a second current electrode coupled to ground. This circuit, in one embodiment, further has a third level shifting circuit having an input coupled to the output of the first gate driver circuit, and an output coupled to the input of the second level shifting circuit; and a fourth level shifting circuit having an input coupled to the output of the second gate driver circuit, and an output coupled to the input of the first level shifting circuit. In one embodiment, the first, second, third, and fourth level shifting circuits each provide substantially a same gate delay. In one embodiment, the circuit further has a voltage regulator circuit that includes a zener diode having a first terminal and a second terminal; a current source having a first terminal coupled to the second terminal of the zener diode, and a second terminal; a comparator having a first input terminal coupled to the second terminal of the zener diode, a second input terminal coupled to the first power supply voltage terminal of the second latching differential pair, and an output; and a transistor having a first current electrode coupled to the second power supply voltage terminal of the second latching differential pair, a control electrode coupled to the output of the comparator, and a second current electrode coupled to the second power supply voltage terminal. In one embodiment, the first latching differential pair includes a first transistor having a first current electrode coupled to the first power supply voltage terminal, a control electrode, and a second current electrode; a second transistor having a first current electrode coupled to the first power supply voltage terminal, a control electrode coupled to the second current electrode of the first transistor, and a second current electrode coupled to the control electrode of the first transistor; a third transistor having a first current electrode coupled to the second current electrode of the first transistor, a control electrode for receiving the first input signal, and a second current electrode coupled to the second power supply voltage terminal; and a fourth transistor having a first current electrode coupled to the second current electrode of the second transistor, a control electrode for receiving the second input signal, and a second current electrode coupled to the second power supply voltage terminal. In one embodiment, the first power supply voltage is higher than the second power supply voltage.

In one embodiment, a circuit includes a first level shifter circuit which has a first transistor having a first current electrode coupled to a first power supply voltage terminal, a control electrode, and a second current electrode; a second transistor having a first current electrode coupled to the first power supply voltage terminal, a control electrode coupled to the second current electrode of the first transistor, and a second current electrode coupled to the control electrode of the first transistor; a third transistor having a first current electrode coupled to the second current electrode of the first transistor, a control electrode for receiving a first input signal, and a second current electrode coupled to a second power supply voltage terminal; a fourth transistor having a first current electrode coupled to the second current electrode of the second transistor, a control electrode for receiving a second input signal, and a second current electrode coupled to the second power supply voltage terminal; a fifth transistor having a first current electrode coupled to the first power supply voltage terminal, a control electrode, and a second current electrode; a sixth transistor having a first current electrode coupled to the first power supply voltage terminal, a control electrode coupled to the second current electrode of the fifth transistor, and a second current electrode coupled to the control electrode of the fifth transistor at an output terminal; a seventh transistor having a first current electrode coupled to the second current electrode of the fifth transistor, a control electrode coupled to the first current electrode of the third transistor, and a second current electrode coupled to a third power supply voltage terminal; and an eighth transistor having a first current electrode coupled to the second current electrode of the sixth transistor, a control electrode coupled to the first current electrode of the fourth transistor, and a second current electrode coupled to the third power supply voltage terminal. In a further embodiment, the circuit also includes a voltage regulator, that includes a zener diode having a first terminal coupled to the first power supply voltage terminal, and a second terminal; a current source having a first terminal coupled to the second terminal of the zener diode, and a second terminal; a comparator having a first input terminal coupled to the second terminal of the zener diode, a second input terminal coupled to the third power supply voltage terminal, and an output coupled to the third power supply voltage terminal; and a transistor having a first current electrode coupled to the third power supply voltage terminal, a control electrode coupled to the output of the comparator, and a second current electrode coupled to the second power supply voltage terminal. In a further embodiment, the circuit further includes a first gate driver circuit having an input coupled to the output terminal of the first level shifter circuit, and an output; and a first drive transistor having a first current electrode coupled to the first power supply voltage terminal, a control electrode coupled to the output of the first gate driver circuit, and a second current electrode for providing an output signal. In a further embodiment, the circuit further includes a second level shifting circuit having an input for receiving an input signal at a first voltage level, and an output for providing an output signal at a second voltage level; a second gate driver circuit having an input coupled to the output of the second level shifting circuit, and an output; and a second drive transistor having a first current electrode coupled to the second current electrode of the first drive transistor, a control electrode coupled to the output of the second gate driver circuit, and a second current electrode coupled to the second power supply voltage terminal. In one embodiment, the third power supply voltage is greater than the second power supply voltage and less than the first power supply voltage.

In one embodiment, a circuit includes a first level shifting circuit that has a first latching differential pair having first and second inputs for receiving first and second input signals, first and second outputs, and first and second power supply voltage terminals for receiving a first power supply voltage; and a second latching differential pair having first and second inputs coupled to the first and second outputs, respectively, of the first latching differential pair, an output, and first and second power supply voltage terminals for receiving a second power supply voltage, the second power supply voltage being different from the first power supply voltage; a first delay circuit having an input coupled to the output of the second latching differential pair, and an output; a first driver circuit having an input coupled to the output of the first delay circuit, and an output; and a first drive transistor having a first current electrode coupled to the first power supply voltage terminal, a control electrode coupled to the output of the first driver circuit, and a second current electrode coupled to an output terminal of the circuit. In a further embodiment, the circuit includes a voltage regulator circuit that has a zener diode having a first terminal and a second terminal; a current source having a first terminal coupled to the second terminal of the zener diode, and a second terminal; a comparator having a first input terminal coupled to the second terminal of the zener diode, a second input terminal coupled to the first power supply voltage terminal of the second latching differential pair, and an output; and a transistor having a first current electrode coupled to the second power supply voltage terminal of the second latching differential pair, a control electrode coupled to the output of the comparator, and a second current electrode coupled to the second power supply voltage terminal of the first latching differential pair. In one embodiment the circuit includes, a second level shifting circuit that has a third latching differential pair having first and second inputs for receiving third and fourth input signals, first and second outputs, and first and second power supply voltage terminals for receiving a third power supply voltage; and a fourth latching differential pair having first and second inputs coupled to the first and second outputs, respectively, of the third latching differential pair, an output, and first and second power supply voltage terminals for receiving the third power supply voltage. In a further embodiment, the circuit includes a second delay circuit having an input coupled to the output of the fourth latching differential pair, and an output; a second driver circuit having an input coupled to the output of the second delay circuit, and an output; and a second drive transistor having a first current electrode coupled to the second current electrode of the first drive transistor, a control electrode coupled to the output of the second driver circuit, and a second current electrode. In one embodiment, the circuit further includes a third level shifting circuit having an input coupled to the output of the first gate driver circuit, and an output coupled to the input of the second level shifting circuit; and a fourth level shifting circuit having an input coupled to the output of the second gate driver circuit, and an output coupled to the input of the first level shifting circuit.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and FIGs. are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a first level shifting circuit comprising:
   a first latching differential pair having first and second inputs for receiving first and second input signals, first and second outputs, and first and second power supply voltage terminals for receiving a first power supply voltage;
   a second latching differential pair having first and second inputs coupled to the first and second outputs of the first latching differential pair, an output, and first and second power supply voltage terminals for receiving a second power supply voltage, the second power supply voltage being different from the first power supply voltage;
   a first plurality of delay elements coupled in series and having an input coupled to the output of the second latching differential pair, and an output;
   a first gate driver circuit having an input coupled to the output of the first plurality of delay elements; and an output; and
   a first drive transistor having a first current electrode coupled to the first power supply voltage terminal, a control electrode coupled to the output of the first gate driver circuit, and a second current electrode coupled to an output terminal of the circuit.

2. The circuit of claim 1, wherein the first power supply voltage terminal of the first latching differential pair is coupled to a first voltage level, the second power supply voltage terminal of the first latching differential pair is coupled to ground, the first power supply voltage terminal of the second latching differential pair is coupled to the first voltage level, and the second power supply voltage terminal of the second latching differential pair coupled to a second voltage level, wherein the second voltage level is between the first voltage level and ground.

3. The circuit of claim 1, further comprising:
   a first logic gate having an output coupled to one of the first and second inputs of the first latching differential pair, and first and second power supply voltage terminals for receiving a third power supply voltage different from the first power supply voltage and the second power supply voltage.

4. The circuit of claim 1, further comprising:
   a second level shifting circuit having an input for receiving an input signal at a first voltage level, and an output for providing an output signal at a second voltage level;
   a second plurality of delay elements coupled in series and having an input coupled to the output of the second level shifting circuit, and an output;
   a second gate driver circuit having an input coupled to the output of the second plurality of delay elements, and an output; and
   a second drive transistor having a first current electrode coupled to the second current electrode of the first drive transistor, a control electrode coupled to the output of the output of the second gate driver circuit, and a second current electrode coupled to ground.

5. The circuit of claim 4, further comprising:
   a third level shifting circuit having an input coupled to the output of the first gate driver circuit, and an output coupled to the input of the second level shifting circuit; and
   a fourth level shifting circuit having an input coupled to the output of the second gate driver circuit, and an output coupled to the input of the first level shifting circuit.

6. The circuit of claim 5, wherein the first, second, third, and fourth level shifting circuits each provide substantially a same gate delay.

7. The circuit of claim 1, wherein the first latching differential pair comprises:
   a first transistor having a first current electrode coupled to the first power supply voltage terminal, a control electrode, and a second current electrode;
   a second transistor having a first current electrode coupled to the first power supply voltage terminal, a control electrode coupled to the second current electrode of the first transistor, and a second current electrode coupled to the control electrode of the first transistor;
   a third transistor having a first current electrode coupled to the second current electrode of the first transistor, a control electrode for receiving the first input signal, and a second current electrode coupled to the second power supply voltage terminal; and
   a fourth transistor having a first current electrode coupled to the second current electrode of the second transistor, a control electrode for receiving the second input signal, and a second current electrode coupled to the second power supply voltage terminal.

8. The circuit of claim 1, wherein the first power supply voltage is higher than the second power supply voltage.

9. A circuit comprising:
a first level shifter circuit comprising:
- a first transistor having a first current electrode coupled to a first power supply voltage terminal, a control electrode, and a second current electrode;
- a second transistor having a first current electrode coupled to the first power supply voltage terminal, a control electrode coupled to the second current electrode of the first transistor, and a second current electrode coupled to the control electrode of the first transistor;
- a third transistor having a first current electrode coupled to the second current electrode of the first transistor, a control electrode for receiving a first input signal, and a second current electrode coupled to a second power supply voltage terminal;
- a fourth transistor having a first current electrode coupled to the second current electrode of the second transistor, a control electrode for receiving a second input signal, and a second current electrode coupled to the second power supply voltage terminal;
- a fifth transistor having a first current electrode coupled to the first power supply voltage terminal, a control electrode, and a second current electrode;
- a sixth transistor having a first current electrode coupled to the first power supply voltage terminal, a control electrode coupled to the second current electrode of the fifth transistor, and a second current electrode coupled to the control electrode of the fifth transistor at a first output terminal;
- a seventh transistor having a first current electrode coupled to the second current electrode of the fifth transistor, a control electrode coupled to the first current electrode of the third transistor, and a second current electrode coupled to a third power supply voltage terminal;
- an eighth transistor having a first current electrode coupled to the second current electrode of the sixth transistor, a control electrode coupled to the first current electrode of the fourth transistor, and a second current electrode coupled to the third power supply voltage terminal;
- a first delay circuit having an input coupled to the first output terminal, and an output;
- a first driver circuit having an input coupled to the output of the first delay circuit, and an output; and
- a first drive transistor having a first current electrode coupled to the first power supply voltage terminal, a control electrode coupled to the output of the first driver circuit, and a second current electrode coupled to an output terminal of the circuit.

10. The circuit of claim 9, wherein the third power supply voltage is greater than the second power supply voltage and less than the first power supply voltage.

11. A circuit comprising:
a first level shifting circuit comprising:
- a first latching differential pair having first and second inputs for receiving first and second input signals, first and second outputs, and first and second power supply voltage terminals for receiving a first power supply voltage; and
- a second latching differential pair having first and second inputs coupled to the first and second outputs, respectively, of the first latching differential pair, an output, and first and second power supply voltage terminals for receiving a second power supply voltage, the second power supply voltage being different from the first power supply voltage;
- a first delay circuit having an input coupled to the output of the second latching differential pair, and an output;
- a first driver circuit having an input coupled to the output of the first delay circuit, and an output; and
- a first drive transistor having a first current electrode coupled to the first power supply voltage terminal, a control electrode coupled to the output of the first driver circuit, and a second current electrode coupled to an output terminal of the circuit.

* * * * *